US010249847B2

(12) United States Patent
Lang et al.

(10) Patent No.: US 10,249,847 B2
(45) Date of Patent: Apr. 2, 2019

(54) ORGANIC LIGHT-EMITTING DIODE, ORGANIC LIGHT MODULE, AND METHOD FOR PRODUCING AN ORGANIC LIGHT-EMITTING DIODE

(71) Applicant: OSRAM OLED GmbH, Regensburg (DE)

(72) Inventors: Erwin Lang, Regensburg (DE); Arne Fleissner, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 211 days.

(21) Appl. No.: 15/527,336

(22) PCT Filed: Nov. 4, 2015

(86) PCT No.: PCT/EP2015/075696
§ 371 (c)(1),
(2) Date: May 17, 2017

(87) PCT Pub. No.: WO2016/078915
PCT Pub. Date: May 26, 2016

(65) Prior Publication Data
US 2017/0324065 A1 Nov. 9, 2017

(30) Foreign Application Priority Data

Nov. 17, 2014 (DE) .................. 10 2014 223 367

(51) Int. Cl.
G04C 17/00 (2006.01)
H01L 27/32 (2006.01)
(Continued)

(52) U.S. Cl.
CPC ...... H01L 51/5268 (2013.01); G04C 17/0091 (2013.01); H01L 27/3202 (2013.01);
(Continued)

(58) Field of Classification Search
CPC ............ H01L 51/5246; H01L 51/5253; H01L 51/003; H01L 51/5203; H01L 27/3202;
(Continued)

(56) References Cited

U.S. PATENT DOCUMENTS

2004/0051451 A1 3/2004 Kawase et al.
2004/0195967 A1 10/2004 Padiyath et al.
(Continued)

FOREIGN PATENT DOCUMENTS

CN 1771127 A 5/2006
CN 101449216 A 6/2009
(Continued)

OTHER PUBLICATIONS

Chinese Office Action based on application No. 201580062499.1 (9 pages) dated May 28, 2018 (for reference purpose only).
(Continued)

Primary Examiner — Muhammad N Edun
(74) Attorney, Agent, or Firm — Viering, Jentschura & Partner MBB

(57) ABSTRACT

An organic light-emitting diode provides a substrate having a top side and one or a plurality of substrate side surfaces running transversely to the top side and connected thereto via a substrate edge; and an organic layer sequence applied to the top side with an emitter layer, which generates electromagnetic radiation coupled out from the diode via a luminous surface during intended operation of the diode. In a plan view of the luminous surface, the sequence adjoins at least a partial region of substrate edge(s), and in the region the luminous surface extends at least as far as the corresponding edge. An encapsulation formed in an uninterrupted and continuous fashion is applied to the sequence. The encapsulation, at least in the region of the edge adjoining the sequence, is led onto the associated substrate side surface, at (Continued)

least partly covers the latter and is in direct contact with the surface.

17 Claims, 14 Drawing Sheets

(51) Int. Cl.
*H01L 33/38* (2010.01)
*H01L 33/40* (2010.01)
*H01L 51/00* (2006.01)
*H01L 51/52* (2006.01)

(52) U.S. Cl.
CPC ........ *H01L 27/3293* (2013.01); *H01L 51/003* (2013.01); *H01L 51/0014* (2013.01); *H01L 51/5203* (2013.01); *H01L 51/5246* (2013.01); *H01L 51/5253* (2013.01); *H01L 33/38* (2013.01); *H01L 33/405* (2013.01); *H01L 2251/5361* (2013.01); *H01L 2251/566* (2013.01)

(58) Field of Classification Search
CPC ............. H01L 51/5268; H01L 51/0014; H01L 27/3293; H01L 33/405; H01L 2251/566; H01L 2251/5361; H01L 33/38; G04C 17/0091
See application file for complete search history.

(56) References Cited

U.S. PATENT DOCUMENTS

| | | | |
|---|---|---|---|
| 2005/0054137 A1 | 3/2005 | Kamiyama et al. | |
| 2007/0274161 A1 | 11/2007 | Rydgren | |
| 2009/0096362 A1 | 4/2009 | Diekmann et al. | |
| 2010/0148209 A1 | 6/2010 | Hatano et al. | |
| 2011/0121352 A1 | 5/2011 | Hesse et al. | |
| 2011/0132449 A1* | 6/2011 | Ramadas ............... | H05B 33/04 136/256 |
| 2011/0177637 A1* | 7/2011 | McCormick ........ | H01L 51/0008 438/28 |
| 2012/0161603 A1 | 6/2012 | Van Montfort et al. | |
| 2013/0119368 A1 | 5/2013 | Nakamura et al. | |
| 2013/0241076 A1 | 9/2013 | Mandlik et al. | |
| 2015/0048329 A1* | 2/2015 | Kim .................... | H01L 51/5253 257/40 |
| 2015/0228923 A1 | 8/2015 | Schicktanz et al. | |

FOREIGN PATENT DOCUMENTS

| | | |
|---|---|---|
| CN | 102598345 A | 7/2012 |
| CN | 103053220 A | 4/2013 |
| CN | 103311454 A | 9/2013 |
| DE | 10 2007 061 473 A1 | 4/2009 |
| DE | 10 2009 046 755 A1 | 5/2011 |
| DE | 10 2012 106 607 A1 | 1/2014 |
| GB | 2403337 A | 12/2004 |
| WO | 2004089620 A2 | 10/2004 |
| WO | 2005 006 441 A1 | 1/2005 |
| WO | 2007 134 643 A1 | 11/2007 |
| WO | 2014048971 A1 | 4/2014 |

OTHER PUBLICATIONS

German Search Report based on application No. 10 2014 223 367.4 (6 pages) dated Oct. 9, 2015 (for reference purpose only).
International Search report based on application No. PCT/EP2015/075696 (6 pages + 3 pages English translation) dated Feb. 4, 2016 (for reference purpose only).

\* cited by examiner

Fig. 1
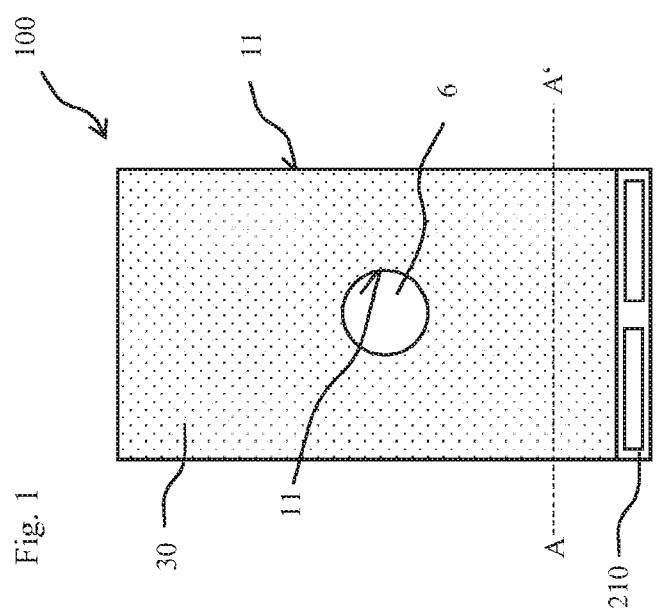
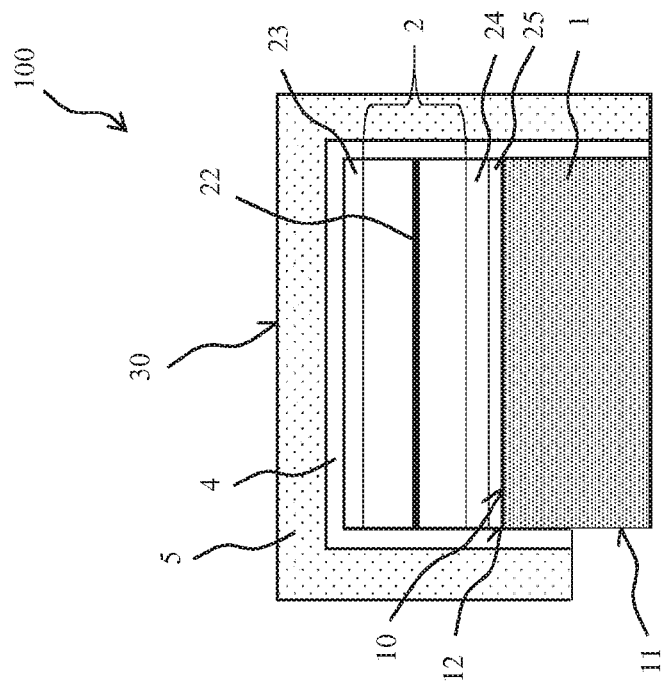

Fig. 2
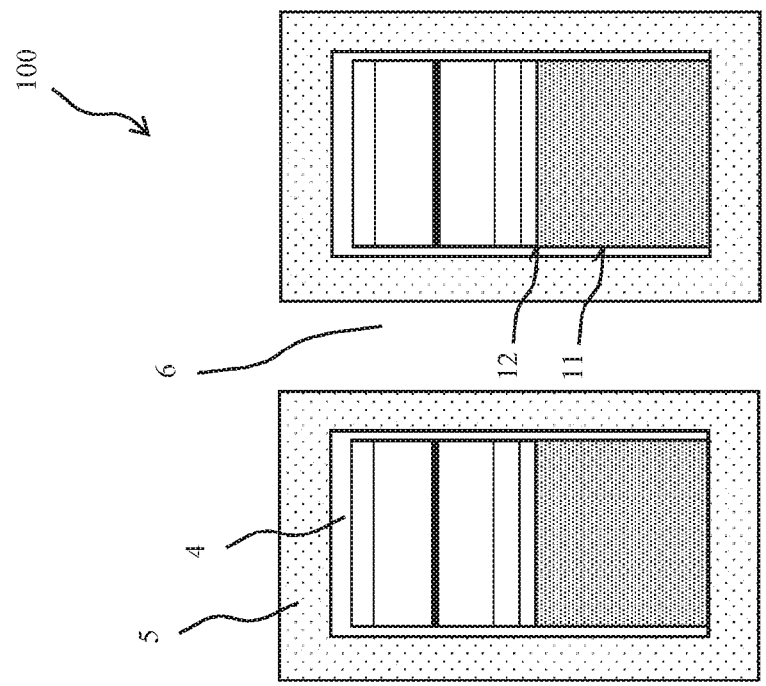
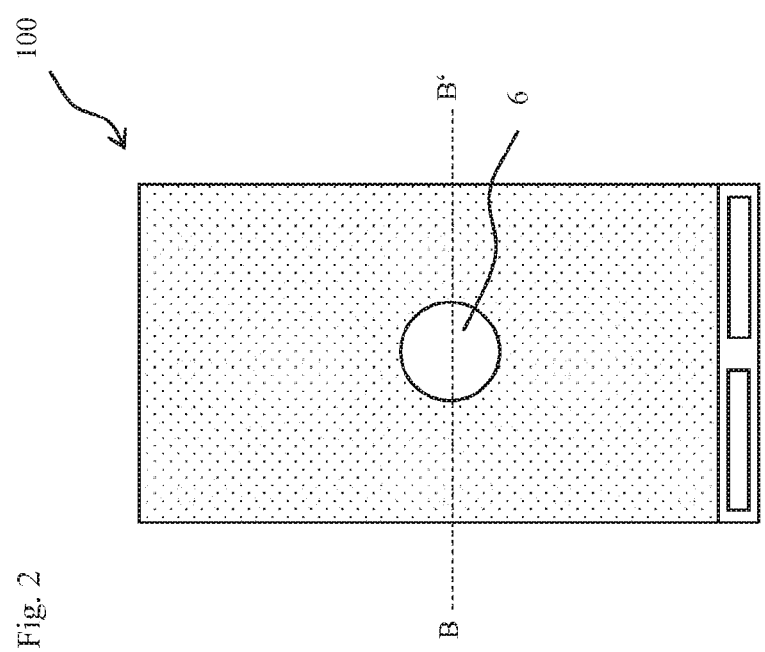

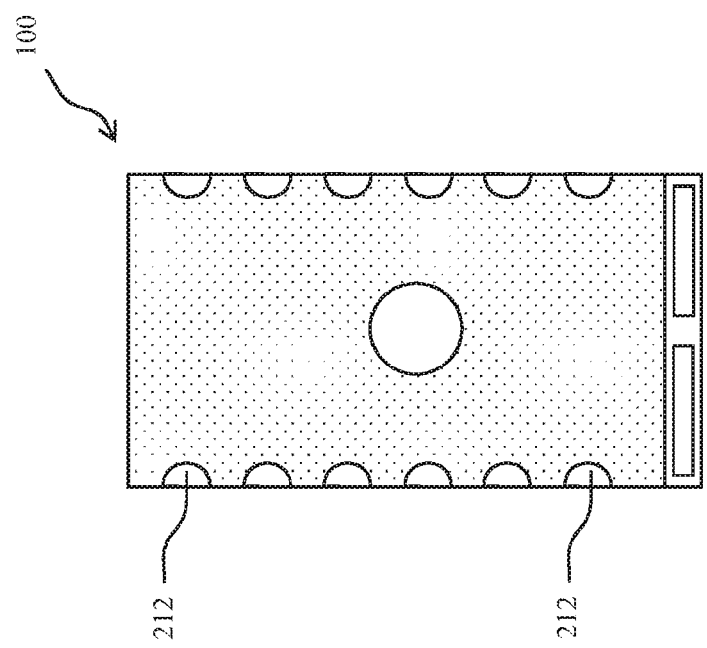
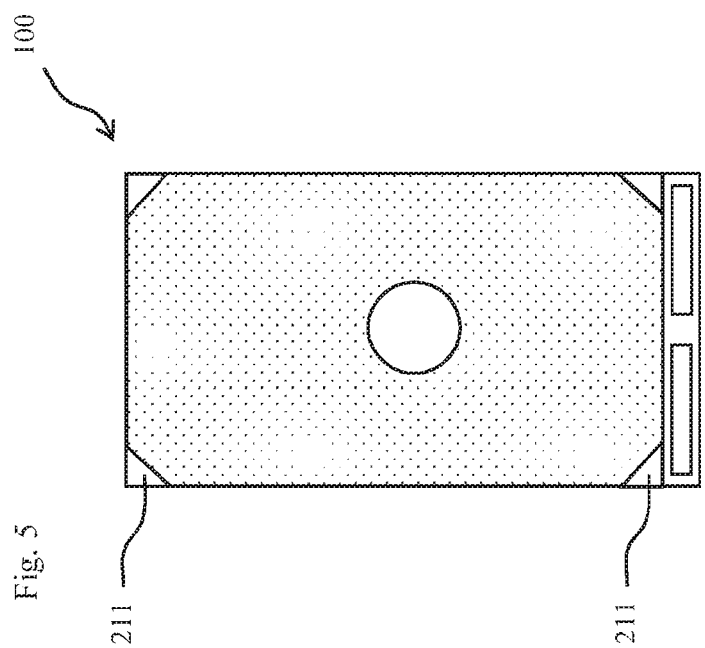
Fig. 5

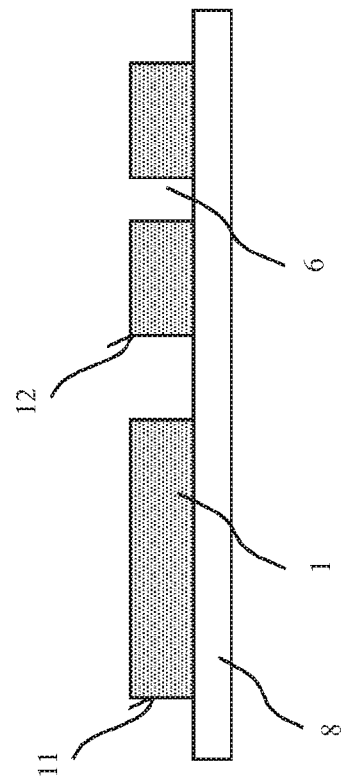
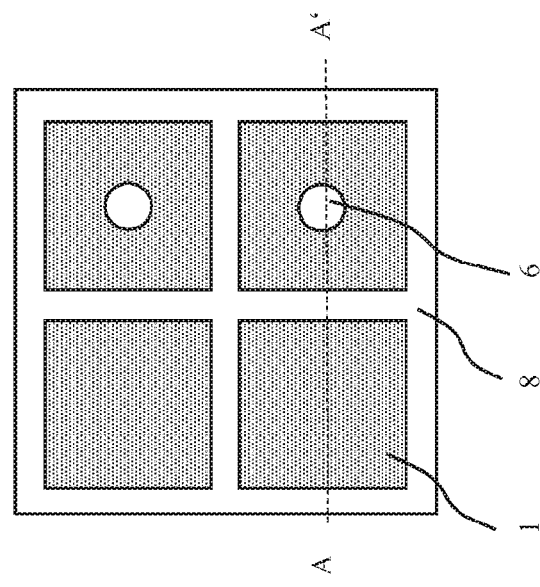
Fig. 8A

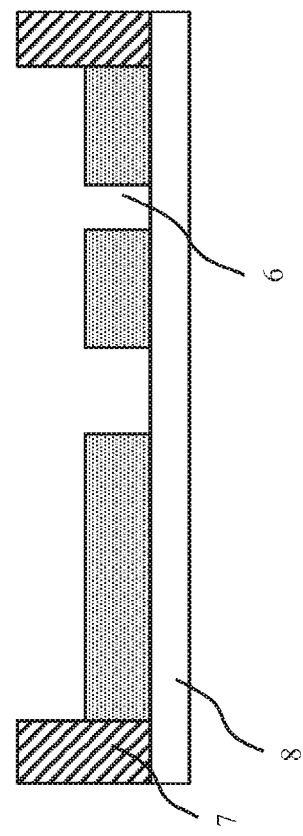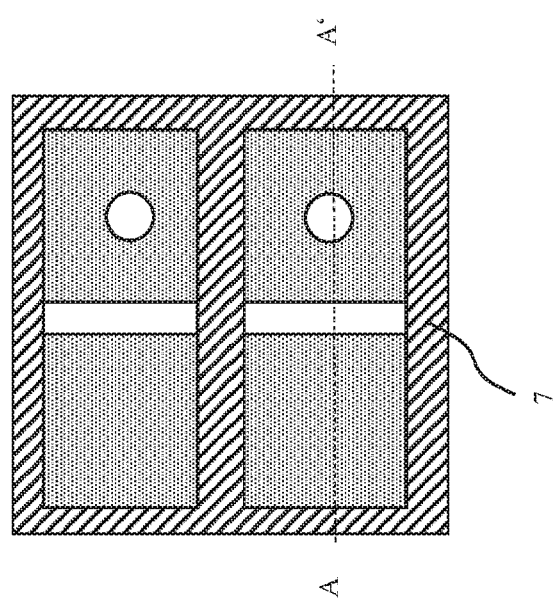
Fig. 8B

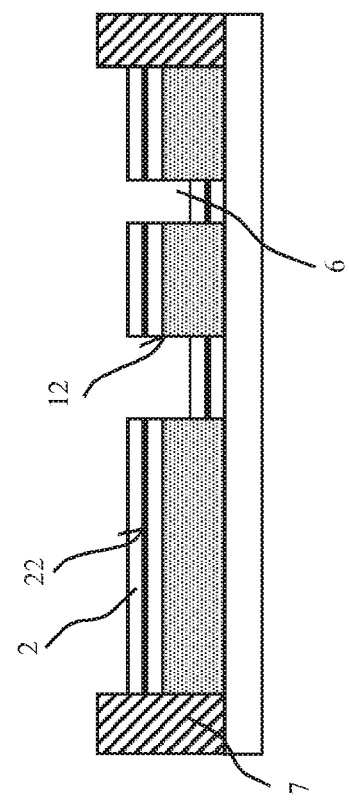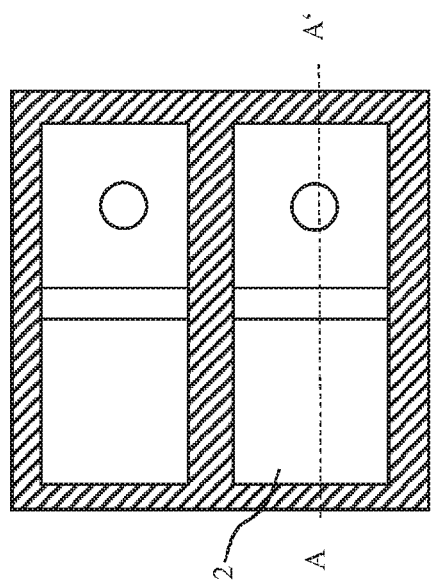
Fig. 8C

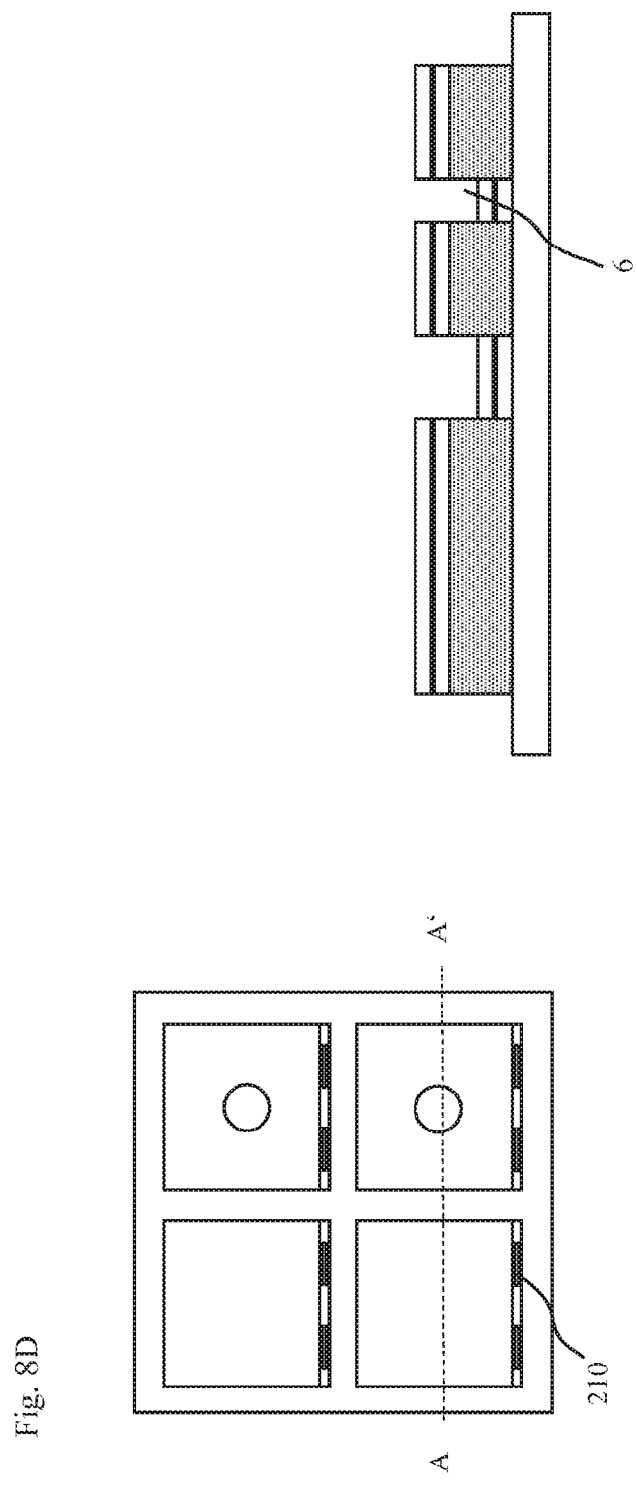

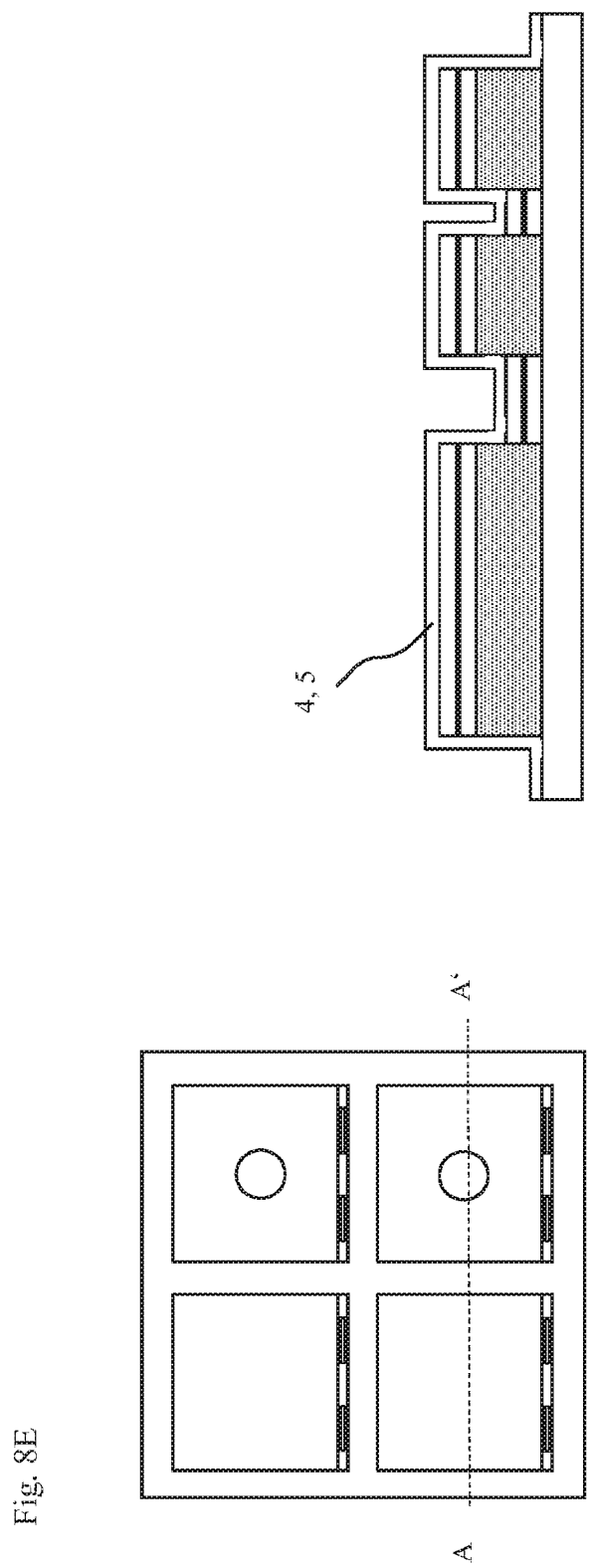

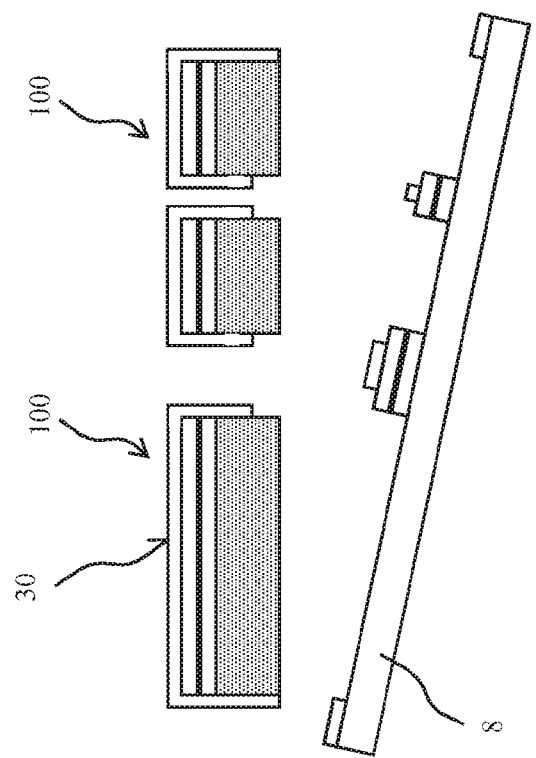
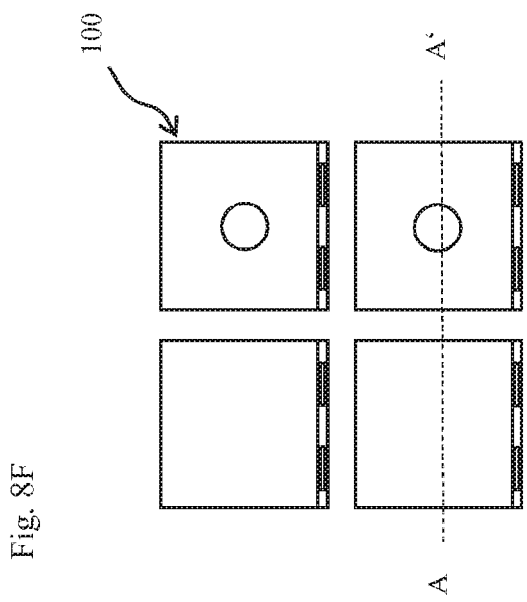
Fig. 8F

ORGANIC LIGHT-EMITTING DIODE, ORGANIC LIGHT MODULE, AND METHOD FOR PRODUCING AN ORGANIC LIGHT-EMITTING DIODE

RELATED APPLICATIONS

The present application is a national stage entry according to 35 U.S.C. § 371 of PCT application No.: PCT/EP2015/075696 filed on Nov. 4, 2015, which claims priority from German application No. 10 2014 223 367.4 filed on Nov. 17, 2014, and is incorporated herein by reference in its entirety.

TECHNICAL FIELD

An organic light-emitting diode and an organic light module are specified. Furthermore, a method for producing an organic light-emitting diode is specified.

BACKGROUND

One object to be achieved is to specify an organic light-emitting diode having a radiation-emitting luminous surface which extends as far as the margins of the organic light-emitting diode. A further object to be achieved is to specify a method for producing such a light-emitting diode.

SUMMARY

These objects are achieved by means of the articles and the method in the independent patent claims. The dependent patent claims relate to advantageous configurations and developments.

In accordance with at least one embodiment, the organic light-emitting diode includes a substrate having a top side and one or a plurality of substrate side surfaces running transversely with respect to the top side. The top side forms for example a main side of the substrate. Furthermore, the top side and the substrate side surfaces are connected to one another in each case via a substrate edge. The angle enclosed between substrate side surfaces and top side in the region of the substrate edges is for example between 60° and 120° inclusive.

The substrate can be a radiation-transmissive substrate, in particular transparent substrate, pellucid substrate or substrate having a milky haze. The substrate may include or consist of a glass or a plastic. Moreover, it is possible for the substrate to be radiation-nontransmissive, for example reflective, specularly reflective or diffusively scattering. To that end, the substrate includes for example one or more metals such as Ag or Al or Cu or tin or zinc or magnesium or iron alloys or a corresponding alloy thereof or consists thereof.

The lateral extent of the substrate along the top side is for example at least 1 cm or ≥10 cm or ≥20 cm. Alternatively or additionally, the lateral extent is ≤50 cm or ≤10 cm or ≤1 cm. A lateral direction hereinafter is a direction parallel or substantially parallel to the top side of the substrate or to a main side of the organic light-emitting diode.

Furthermore, the substrate can be a flexible substrate which can be rolled up, for example, or in which regions of opposite substrate side surfaces can be tilted with respect to one another by at least 60° or 100° or 140°, without the substrate being permanently deformed in the process. To that end, the substrate can have for example a thickness of at most 500 µm or at most 100 µm or at most 10 µm.

However, it is also conceivable for the substrate to be a rigid substrate in which regions of opposite substrate side surfaces can be tilted with respect to one another for example by at most 5° or at most 10° or at most 20° before the substrate permanently loses its shape, for example breaks. To that end, the substrate can have in particular a thickness of ≥100 µm or ≥300 µm or ≥500 µm.

In accordance with at least one embodiment, an organic layer sequence is applied to the top side of the substrate. The organic layer sequence includes at least one emitter layer that generates electromagnetic radiation, advantageously radiation visible to human beings, during intended operation of the light-emitting diode. The radiation generated by the emitter layer during operation is advantageously coupled out from the organic light-emitting diode via a luminous surface.

The luminous surface can run for example parallel or substantially parallel to the top side of the substrate. In particular, the luminous surface runs along a main side of the light-emitting diode and covers for example at least 80% or ≥90% or ≥95% of the main side of the light-emitting diode. The luminous surface can be arranged for example on an underside of the substrate, said underside facing away from the organic layer sequence; in this case, the light-emitting diode is formed as a so-called bottom emitter. Moreover, it is possible for the light-emitting diode to be formed alternatively or additionally on a side of the organic layer sequence that faces away from the substrate, such that the organic light-emitting diode is a so-called top emitter or a so-called top-bottom emitter.

Besides the emitter layer, the organic layer sequence may include further layers such as electron or hole transport layers or electron or hole injection layers, which are based on an organic material just like the emitter layer. Moreover, it is possible for the organic layer sequence to include a plurality of emitter layers that generate and emit light of different wavelengths. The organic layer sequence can emit white light, in particular.

In addition, the organic layer sequence is advantageously arranged between two electrodes. A bottom electrode is fitted between substrate and organic layer sequence; a top electrode is fitted on that side of the organic layer sequence which faces away from the substrate. The top electrode and/or the bottom electrode may include or be formed from a metal such as silver or gold or aluminum or titanium. In particular, one of the two electrodes can be formed as reflective, advantageously specularly reflective. Particularly advantageously, the top electrode and/or the bottom electrode are/is transparent, in particular pellucid or have/has a milky haze. By way of example, the corresponding electrode includes or consists of a transparent conductive oxide, TCO for short, such as indium tin oxide, ITO for short. Other TCOs, such as fluorine tin oxide or aluminum zinc oxide, for example, are also conceivable. Transparent electrodes composed of thin metal layers, referred to as "thin metal electrode", TME for short, are also possible, which have for example thicknesses of ≤50 nm or ≤20 nm or ≤10 nm.

In accordance with at least one embodiment, in a plan view of the luminous surface the organic layer sequence adjoins at least a partial region of at least one substrate edge. In the partial region the organic layer sequence can terminate flush with the corresponding substrate side surface. However, it is also possible for the organic layer sequence adjoining the substrate edge to project or be recessed in a lateral direction relative to the substrate side surface by a few 10 µm, in particular by at most 200 µm or at most 100 µm or at most 10 µm. In this case, each individual functional layer of the organic layer sequence, in particular the emitter layer, can be at this distance from the substrate edge. However, the top electrode and/or the bottom electrode can also be at such a maximum distance from the substrate edge. As a result, for an average observer situated at a normal distance from the light-emitting diode of at least 20 cm, for example, it may appear as though the organic layer sequence exactly adjoins the substrate edge.

What can be achieved in turn in this way is that during operation in the partial region of the substrate edge the luminous surface extends as far as the corresponding substrate edge or even beyond the latter. In a plan view of the luminous surface, for an average observer at an appropriate distance, it may then at least appear as though the luminous surface extends as far as the margin of the light-emitting diode. In particular, the luminous surface in the corresponding partial region is then not delimited by a margin that appears dark for example from the substrate.

Further functional layers, for example electrodes or planarizations, can be arranged between the top side of the substrate and the organic layer sequence.

The planarization may include or consist of, for example, inorganic materials, such as dielectrics, or organic materials. In particular, one or more of the following materials are appropriate for the planarization: silicone, acrylate, epoxy, polyurethane, nitrides, such as SiN, oxides, such as $SiO_2$. The layer thickness of an organic planarization is for example $\geq 1$ µm or $\geq 2$ µm or $\geq 5$ µm. Alternatively or additionally, the layer thickness of the organic planarization is $\leq 20$ µm or $\leq 15$ µm or $\leq 10$ µm. The layer thickness of an inorganic planarization is for example $\geq 10$ nm or $\geq 50$ nm or $\geq 200$ nm. Alternatively or additionally, the layer thickness of the inorganic planarization is $\leq 10$ µm or $\leq 5$ µm or $\leq 1$ µm.

If the substrate is for example metallic or at least electrically conductive, the planarization can also be used for electrical insulation between bottom electrode and substrate.

In accordance with at least one embodiment, the organic light-emitting diode includes an encapsulation formed in an uninterrupted and continuous fashion. In this case, the encapsulation is applied for example to the organic layer sequence. The encapsulation can completely surround and cover for example all surfaces or sides of the organic layer sequence which face away from the substrate. In particular, the encapsulation also covers the top and bottom electrodes.

The encapsulation is advantageously drawn over side surfaces of the organic layer sequence, said side surfaces running transversely with respect to the top side of the substrate, right onto the substrate or right onto regions of the electrodes that project laterally beyond the organic layer sequence. Contact regions arranged for example laterally alongside the organic layer sequence on the electrodes or the substrate are advantageously free of the encapsulation. In particular, the encapsulation protects the organic layer sequence for example against external mechanical influences or serves as a diffusion barrier for protection against ingress of moisture or oxygen.

In accordance with at least one embodiment, the encapsulation at least in the region of the substrate edge adjoining the organic layer sequence is led right onto the associated substrate side surface and at least partly covers said substrate side surface. However, it is also possible for the encapsulation to completely cover the substrate side surfaces, for example all the substrate side surfaces. In a plan view of the substrate side surface, the encapsulation covers at least that partial region of the substrate edge which adjoins the organic layer sequence, wherein the encapsulation in this case runs in a continuous and uninterrupted fashion between substrate side surface and side surfaces of the organic layer sequence.

Advantageously, the encapsulation is in direct contact with the corresponding substrate side surface. In particular, therefore, no further layer or no further material, such as a connection medium, for example adhesive, is applied between the substrate side surface and the encapsulation. Particularly advantageously, no additional connection medium at all, such as an adhesive, is used for the mechanical connection between the encapsulation and the substrate and/or the organic layer sequence.

In at least one embodiment, the organic light-emitting diode includes a substrate having a top side and one or a plurality of substrate side surfaces running transversely with respect to the top side, wherein the top side and the substrate side surfaces are connected to one another in each case via a substrate edge. In addition, the organic light-emitting diode includes an organic layer sequence applied to the top side and having an emitter layer, which generates electromagnetic radiation during intended operation of the light-emitting diode, wherein the radiation is coupled out from the organic light-emitting diode via a luminous surface. In this case, in a plan view of the luminous surface the organic layer sequence adjoins at least a partial region of at least one substrate edge, wherein in said partial region the luminous surface extends at least as far as the corresponding substrate edge. Furthermore, the organic light-emitting diode includes an encapsulation formed in an uninterrupted and continuous fashion which is applied to the organic layer sequence. In this case, the encapsulation, at least in the region of the substrate edge adjoining the organic layer sequence, is led right onto the associated substrate side surface and at least partly covers the latter.

Customary organic light-emitting diodes, hereinafter also abbreviated to OLED, often include luminous surfaces which are surrounded by a non-luminous, dark margin, for example from the substrate. If a plurality of OLEDs are placed against one another, with such OLEDs a large-area luminous surface that appears continuous and uninterrupted cannot be formed or can be formed only with increased outlay.

The present disclosure described here makes use, inter alia, of the concept of leading the organic layer sequence, in particular the emitter layer contained therein, and also electrodes as far as the substrate edges of the substrate, such that the organic layer sequence adjoins the substrate edges. In a plan view of the OLED, the marginal region of the substrate, in particular the substrate edge, is then no longer visible to an observer during operation, but rather is covered by the luminous surface. The OLED then appears at least partly marginless. By placing the marginless regions of a plurality of OLEDs against one another, it is then possible to realize a large luminous surface that appears uninterrupted and continuous.

Advantageously, a light-emitting diode as described above, on the top side of the substrate, also does not have an adhesive region, for example an adhesive region running all around at the margin of the substrate, which region appears as a dark margin in a plan view of the luminous surface. Such adhesive regions are often used if the organic layer sequence is encapsulated with a glass cover.

In accordance with at least one embodiment, the organic layer sequence adjoins the substrate edge along the entire lateral extent of the corresponding substrate edge. That is to say, in particular, that during operation the luminous surface extends at least as far as the substrate edge along the entire substrate edge and covers the latter, for example.

In accordance with at least one embodiment, the organic light-emitting diode includes contact regions. The contact regions serve, in particular, for electrically contacting the organic layer sequence during intended operation. The contact regions are for example electrically connected to the top and bottom electrodes, such that the current fed in via the contact regions is injected into the organic layer sequence by means of the electrodes. The contact regions can be arranged for example on the top side of the substrate or on one or a plurality of side surfaces or the rear side of the organic light-emitting diode.

In accordance with at least one embodiment, the encapsulation includes or consists of a thin-film encapsulation. The thin-film encapsulation can have for example a thickness of at least 1 nm or at least 10 nm or at least 100 nm. Alternatively or additionally, the thickness of the thin-film encapsulation is at most 5 µm or at most 500 nm or at most 200 nm. In particular, the thin-film encapsulation can consist of one or a plurality of individual layers. In this case, each of said individual layers can each include or consist of one or more of the following materials: aluminum oxide, zinc oxide, zirconium oxide, titanium oxide, hafnium oxide, lanthanum oxide, tantalum oxide, silicon nitride, silicon oxide, silicon oxynitride, indium tin oxide, indium zinc oxide, aluminum-doped zinc oxide.

In accordance with at least one embodiment, the thin-film encapsulation is at least partly in direct contact with the organic layer sequence. Advantageously, the thin-film encapsulation is in direct contact with the substrate side surface covered by it.

In accordance with at least one embodiment, the encapsulation includes or consists of an anti-scratch protective layer. The anti-scratch protective layer can be applied for example after the thin-film encapsulation, such that the thin-film encapsulation is arranged between organic layer sequence and anti-scratch protective layer. By way of example, the anti-scratch protective layer is applied partly or completely to the sides of the thin-film encapsulation which face away from the organic layer sequence, and is in direct contact with the thin-film encapsulation. The anti-scratch protective layer can have in particular a thickness of at least 2 µm or at least 5 µm or at least 10 µm. Alternatively or additionally, the thickness of the anti-scratch protective layer is at most 200 µm or at most 100 µm or at most 50 µm. The anti-scratch protective layer includes or consists of, for example, at least one of the following materials: silicone, acrylate, epoxy, polyurethane. The anti-scratch protective layer protects the organic light-emitting diode advantageously against mechanical loadings.

In accordance with at least one embodiment, the anti-scratch protective layer includes scattering particles. The scattering particles can be for example particles having an average diameter of at least 50 nm or ≥500 nm or ≥5 µm. In particular, the scattering particles have a refractive index that deviates from that of the remaining material of the anti-scratch protective layer, such that light, in particular the light emitted by the emitter layer, which passes through the anti-scratch protective layer is scattered, for example is diffusively scattered, at the scattering particles. The scattering particles are formed for example from an aluminum oxide or titanium oxide or include such a material. Furthermore, the anti-scratch protective layer can also be photoluminescent, for example include luminescent particles. The anti-scratch protective layer is then configured to convert at least part of the radiation emitted by the emitter layer into radiation of a different wavelength.

Furthermore, the anti-scratch protective layer and/or the thin-film encapsulation can be flexible, as explained in association with the substrate. Moreover, the anti-scratch protective layer can have a UV-blocking effect in order to protect the organic layer sequence against external UV radiation. In particular, the anti-scratch protective layer can also be formed from a plurality of individual layers.

In accordance with at least one embodiment, the anti-scratch protective layer is an uninterrupted and continuous layer. In this case, for example, not only can the anti-scratch protective layer cover the organic layer sequence or the substrate side surfaces of the substrate, but it can also be fitted on the underside of the substrate. In particular, in a side view of the organic light-emitting diode the anti-scratch protective layer can be led completely and without interruption around the organic light-emitting diode. The organic light-emitting diode can also be completely surrounded by the anti-scratch protective layer apart from the contact regions, such that all surfaces of the organic light-emitting diode are completely surrounded in a positively locking manner by an anti-scratch protective layer formed in a continuous manner free of interruption.

In accordance with at least one embodiment, the organic layer sequence adjoins a plurality of substrate edges, such that the luminous surfaces extend at least as far as the substrate edges in a plurality of regions. In particular, the organic layer sequence can adjoin a plurality of substrate edges in each case along the entire lateral extent of the respective substrate edge.

In accordance with at least one embodiment, the organic layer sequence adjoins a substrate edge that belongs to a marginal surface that laterally delimits the substrate. In this case, a marginal surface should be understood to mean a substrate side surface which delimits and defines the lateral extents of the substrate. The marginal surfaces are thus outer substrate side surfaces and not substrate side surfaces in the region of cutouts within the substrate.

If the organic light-emitting diode has a polygonal shape for example in plan view, such as a triangle or rectangle or hexagon, then contact regions for electrically contacting the light-emitting diode can be arranged at one or more sides of the polygon in a plan view of the luminous surface. At all other sides, the organic layer sequence can be led completely to the outer substrate edges, such that in the region of these sides, during operation, the luminous surface is not delimited by a margin of the organic light-emitting diodes that appears dark. Apart from in the region of the contact regions, the organic light-emitting diode can then appear completely marginless in plan view and emit radiation along its entire main side. This is also possible for other basic shapes of the light-emitting diode.

In accordance with at least one embodiment, the organic light-emitting diode includes at least one cutout. In this case, the cutout advantageously extends transversely with respect to the top side of the substrate and completely penetrates through, for example, the entire light-emitting diode, in particular the substrate and/or the organic layer sequence. In particular, the cutout is formed as a hole in the light-emitting diode, such that the cutout is laterally completely surrounded by the organic layer sequence and/or the substrate.

In accordance with at least one embodiment, the organic layer sequence adjoins a substrate edge that laterally delimits the cutout in a plan view of the luminous surface. In said plan view, the luminous surface then extends in particular as far as the cutout. In plan view no margin that appears dark is then situated between luminous surface and cutout.

Furthermore, an organic light module is specified.

The organic light module includes a plurality of organic light-emitting diodes as described above. In particular, in the case of the organic light module, at least two organic light-emitting diodes can be combined such that the substrate edges adjoining the organic layer sequence in each case bear against one another. As a result a common luminous surface that appears continuous and free of interruption can be formed during the operation of both light-emitting diodes. For an average observer at an appropriate distance from the luminous surface, the common luminous surface than appears to be without interruption. In particular, the common luminous surface does not appear to be pervaded by a non-luminous dark trench arising through the interface between the two light-emitting diodes placed against one another.

In this way, it is possible to achieve a tiling of two or more organic light-emitting diodes to form a large luminous surface that appears continuous and without interruption.

In accordance with at least one embodiment, the substrate edges of the organic light-emitting diodes that are placed against one another are at a lateral distance from one another of at most 400 µm or at most 200 µm or at most 100 µm. In this case, the lateral distance between the substrate edges results in particular from the thicknesses of the encapsulations applied on the substrate side surfaces in the region of the corresponding substrate edges. The thinner the encapsulations, the nearer, therefore, the substrate edges of two adjacent light-emitting diodes can be placed against one another.

In accordance with at least one embodiment, a scattering layer formed in a continuous and uninterrupted fashion is applied to the plurality of light-emitting diodes. In this case, the scattering layer advantageously runs parallel or substantially parallel to the top sides of the organic light-emitting diodes or parallel to the luminous surfaces of the organic light-emitting diodes. In particular, in this case the light modules are covered by the scattering layer at least in the region of the substrate edges placed against one another. The trench running between the substrate edges placed against one another is advantageously completely covered by the scattering layer in plan view.

Like the anti-scratch protective layer, the scattering layer may include or consist of a silicone, acrylate, epoxy or polyurethane. Furthermore, the scattering layer can also include scattering particles as mentioned in association with the anti-scratch protective layer. Such a scattering layer in the region of the trench between two adjacent light-emitting diodes can further intensify the appearance of a light-emitting diode formed in a continuous manner free of interruption between a plurality of adjacent light-emitting diodes. In particular, the last remnants of a trench that appears dark between adjacent light-emitting diodes can be masked out for an observer by scattering effects within the scattering layer.

Furthermore, a method for producing an organic light-emitting diode is specified. The method can be used for producing an organic light-emitting diode as described above. Therefore, features of the organic light-emitting diode are also disclosed for the method, and vice versa.

In accordance with at least one embodiment, the method includes a step A), which involves providing a substrate having a top side and one or a plurality of substrate side surfaces running transversely with respect to the top side. The top side and the substrate side surfaces here are connected to one another in each case via a substrate edge.

In accordance with at least one embodiment, in a step B) an organic layer sequence is applied to the top side of the substrate. In this case, the organic layer sequence is applied such that in a plan view of the top side the organic layer sequence adjoins at least one substrate edge at least in a partial region. Furthermore, the organic layer sequence includes at least one emitter layer that emits electromagnetic radiation during intended operation of the light-emitting diode.

Applying the organic layer sequence as far as a substrate edge can be carried out with the aid of a mask, for example, wherein the mask constitutes a lateral delimitation of the top side and bears against at least one substrate side surface. The mask then prevents the organic layer sequence from being applied to the top side beyond the substrate edge. The applied organic layer sequence then adjoins the corresponding substrate edge in the region of the mask bearing against the substrate side surface. Moreover, the mask can cover regions, for example contact regions, on the top side and protect them from the application of the layer sequence.

Alternatively, however, it is also possible for the organic layer sequence to be applied beyond a substrate edge, for example if no delimiting mask is used in the region of a substrate side surface. The substrate edge then acts for example as a tear-off edge at which the organic layer sequence and also possibly applied electrodes tear off and subsequently adjoin the substrate edge on the top side. In this case, the organic layer sequence can for example at least partly curve over the corresponding substrate edge and enclose the substrate edge in a positively locking manner.

Moreover, it is possible, however, that, during the application of the organic layer sequence, the organic layer sequence is slightly recessed relative to the substrate edge for example with the aid a mask and is at a distance as described above from the substrate edge.

The organic layer sequence can be applied for example by vapor deposition or by application of an organic solution with subsequent evaporation of the solvent, for example by inkjet printing or spin-coating.

Furthermore, advantageously before the application of the organic layer sequence a bottom electrode is applied to the top side of the substrate, for example by means of vaporization of aluminum, copper, silver, gold or by sputtering. After the vapor deposition of the organic layer sequence, a top electrode can additionally be applied, for example by vapor deposition. Advantageously, the bottom electrode and/or the top electrode are/is applied such that they adjoin the substrate edge at least in a partial region.

In accordance with at least one embodiment, in a step C), an encapsulation formed in an uninterrupted and continuous fashion is applied, advantageously directly applied, to the organic layer sequence. The encapsulation is thus applied in particular over the whole area. In this case, advantageously, the encapsulation also in the region of the substrate edge adjoining the organic layer sequence is led onto the associated substrate side surface and for example brought into direct contact with the substrate side surface. The encapsulation thus subsequently covers the substrate side surface and the organic layer sequence in the region of the mutually adjoining substrate edge and organic layer sequence.

In accordance with at least one embodiment, steps A) to C) are carried out in the order indicated.

In accordance with at least one embodiment, in step C), a thin-film encapsulation is applied to the exposed outer surfaces of the organic layer sequence and/or of the substrate. Afterward, for example, an anti-scratch protective layer is then applied to the thin-film encapsulation, at least to the sides of the thin-film encapsulation which face away from the organic layer sequence. In this case, the anti-scratch protective layer advantageously includes scattering particles.

In accordance with at least one embodiment, in step A), the substrate is provided on an auxiliary carrier. In this case, the top side of the substrate lies on an elevated plane relative to the auxiliary carrier. A step is thus formed between the top side of the substrate and the auxiliary carrier, wherein a side surface of the step is formed by a substrate side surface. Furthermore, a substrate edge belonging to the step forms a tear-off edge for the later application of the organic layer sequence.

In accordance with at least one embodiment, in step B), the organic layer sequence is applied laterally beyond the tear-off edge in places. In this case, both the top side of the substrate and the auxiliary carrier are at least partly covered by the organic layer sequence. During application the step furthermore has the effect that the organic layer sequence is interrupted along the tear-off edge. As a result, the parts of the organic layer sequence which are applied on the auxiliary carrier are not continuously connected to the organic layer sequence situated on the top side of the substrate. Rather, the tear-off edge or the step brings about a discontinuous offset between the organic layer sequence on the auxiliary carrier and the organic layer sequence on the top side. Upon applying the organic layer sequence laterally beyond the tear-off edge, what is achieved is that the organic layer sequence adjoins the substrate edge.

In accordance with at least one embodiment, in a step D), which is advantageously performed after step C), the auxiliary carrier is detached, wherein the parts of the organic layer sequence which are situated on the auxiliary carrier, together with the auxiliary carrier, are removed from the substrate.

All steps for applying the organic layer sequence as described above can also be used for applying further functional layers, such as electrodes or planarizations.

In accordance with at least one embodiment, before step A) firstly a substrate blank is applied on the auxiliary carrier. The substrate blank consists of the same material as the substrate. Afterward the substrate blank is cut to size to form the substrate for example by means of a laser cutting method, or mechanical cutting method or stamping method. In this case, the substrate blank is severed along its entire thickness; the auxiliary carrier can remain intact or likewise be at least partly severed. In a subsequent step, the remnants of the substrate blank that do not belong to the substrate are detached from the auxiliary carrier.

In accordance with at least one embodiment, before step A) the substrate blank is firstly applied to an intermediate film. The intermediate film can be for example an adhesive film such as a double-sided adhesive film. Afterward the substrate blank can be cut to size to form the substrate by means of a stamping method or mechanical cutting method or laser cutting method. In this case, the substrate acquires its predefined form. In a subsequent step, the remnants of the substrate blank that do not belong to the substrate can then be detached from the intermediate film. Alternatively, however, it is possible for the intermediate film also to be completely severed during the stamping method. Afterward the substrate can be applied on the auxiliary carrier. In this case, the intermediate film as adhesive layer can mediate a mechanical fixing between substrate and auxiliary carrier. However, it is also possible for the substrate to be applied to the auxiliary carrier by a side facing away from the intermediate film and for the intermediate film subsequently to be detached, for example.

An organic light-emitting diode described here, an organic light module described here and also a method described here for producing an organic light-emitting diode are explained in greater detail below on the basis of embodiments with reference to drawings. In this case, identical reference signs indicate identical elements in the individual figures. In this case, however, relations to scale are not illustrated; rather, individual elements may be illustrated with exaggerated size in order to afford a better understanding.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIGS. 1 to 5 show embodiments of an organic light-emitting diode described here in plan view and in side view, FIGS. 8A to 9C show various embodiments of method steps of a method described here.

DETAILED DESCRIPTION

Figure 3:
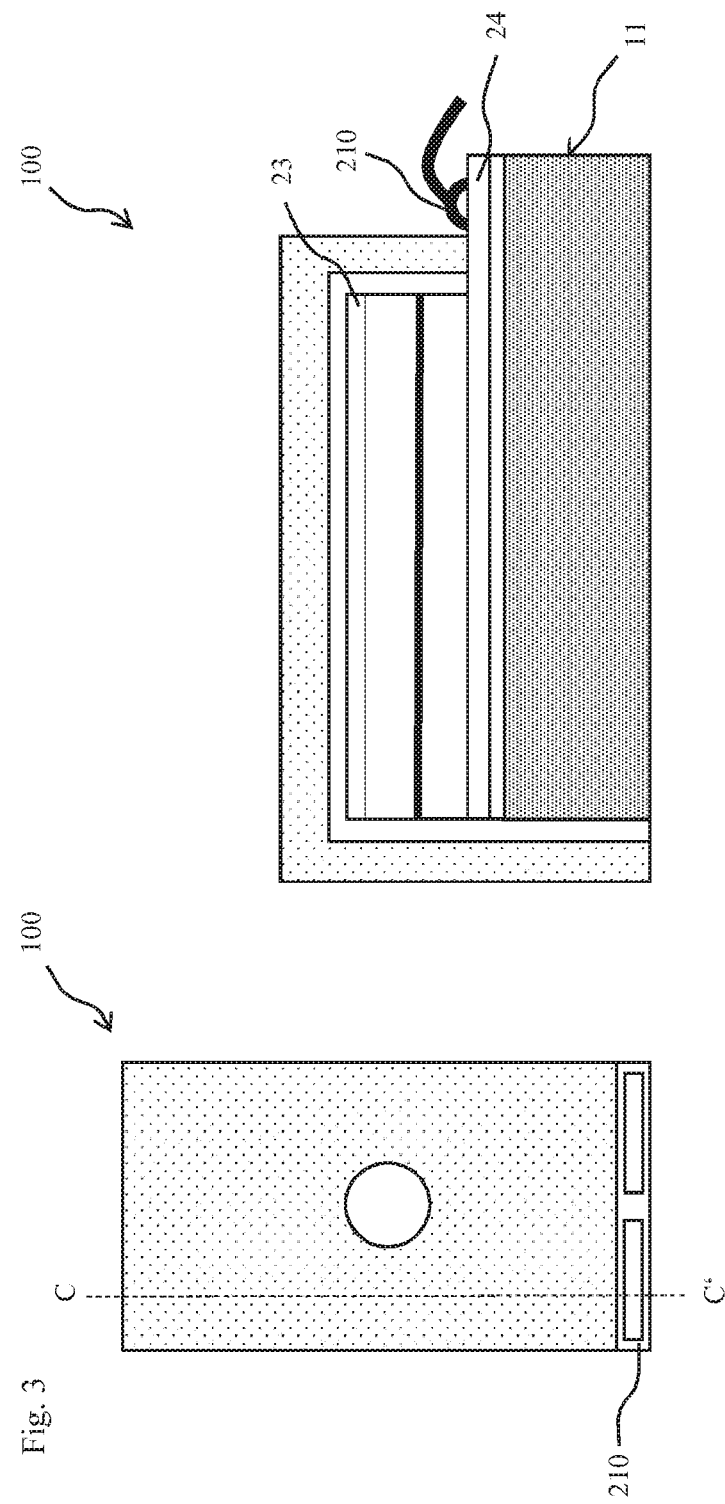

FIG. 1 shows on the left-hand side one embodiment of an organic light-emitting diode 100 in plan view; on the right-hand side, the same organic light-emitting diode 100 is shown in cross-sectional view in a section along the line AA'.

In plan view it can be discerned that the organic light-emitting diode 100, hereinafter designated as OLED 100, has a rectangular cross-sectional shape and is completely penetrated by a cutout 6. In addition, contact regions 210 are situated on one side of the OLED 100, said contact regions being provided for electrically contacting the OLED 100. In the plan view of the OLED 100, a luminous surface 30 can be discerned, via which the OLED 100 emits electromagnetic radiation and which is perceived as a luminous surface by an observer during operation.

The construction of the OLED 100 is illustrated in detail in the side view on the right-hand side of FIG. 1. In this case, the OLED 100 includes a substrate 1, which in the present case is formed for example from a metal such as Al. The substrate 1 is mechanically flexible, for example, but can also be rigid. The substrate 1 furthermore has a top side 10 formed as a main side of the substrate 1 and side surfaces 11 running transversely with respect to the top side 10. The side surfaces 11 and the top side 10 are connected to one another in each case via substrate edges 12.

A planarization 25 for example composed of an insulating material such as silicon oxide or silicon nitride is applied on the top side 10. Furthermore, a bottom electrode 24, an organic layer sequence 2 and a top electrode 23 in this order are arranged on that side of the planarization 25 which faces away from the substrate 1. In this case, the bottom electrode 24 is formed for example from a metal such as Cu or Al or Ag or Au; the top electrode 23 is formed for example from a transparent conductive material such as indium tin oxide. A thin transparent metal electrode, referred to as "thin metal electrode", TME for short, is also possible. The organic layer sequence includes an emitter layer 22, which generates electromagnetic radiation advantageously in the visible spectral range during intended operation of the OLED 100. The electromagnetic radiation 22 can be coupled out from the OLED 100 via the transparent top electrode 23. In the present case, the luminous surface 30 is thus formed by a surface of the OLED 100 which faces away from the substrate 1.

Besides the emitter layer 22, the organic layer sequence 2 may include further emitter layers and also electron or hole injection or transport layers.

In the embodiment in FIG. 1, the organic layer sequence 2 is applied to the top side 10 of the substrate 1 such that in a plan view of the luminous surface 30 the organic layer sequence 2 adjoins at least one substrate edge 12. In this case, as can be discerned in the cross-sectional view, adjoin does not necessarily mean a direct contact between the organic layer sequence 2 and the substrate edge 12; rather, "adjoin" should be understood to mean that the lateral distance between organic layer sequence 2 and substrate edge 12 is for example less than 100 µm. In the example in FIG. 1, the emitter layer 22 is also led as far as the substrate edge 12 and adjoins the substrate edge 12 in the above sense.

In FIG. 1, the electrodes 23, 24 additionally adjoin the substrate edge 12 in the above sense. The functional layer stack including organic layer sequence 2 and electrodes 23, 24 terminates flush with the substrate side surfaces 11 in the case of FIG. 1. The luminous surface 30, via which the radiation generated in the emitter layer 22 is coupled out from the OLED 100, therefore extends at least as far as the substrate edges 12, such that in the plan view in the left-hand illustration in FIG. 1 the substrate edges 12 are covered by the luminous surface 30 and during operation the luminous surface 30 is not delimited laterally by dark margins of the substrate 1.

In the example of FIG. 1, moreover, a thin-film encapsulation 4 is applied to the organic layer sequence 2 and also to the top and bottom electrodes 23, 24, said thin-film encapsulation in the present case for example consisting of aluminum oxide and having a layer thickness of 100 nm. The thin-film encapsulation 4 here completely covers all sides of the organic layer sequence 2 and/or of the electrodes 23, 24 which are not covered by the substrate 1. In particular, the thin-film encapsulation 4 is in direct contact with the organic layer sequence 2 and the electrodes 23, 24. The thin-film encapsulation 4 acts for example as a diffusion barrier and prevents moisture from penetrating into the organic layer sequence 2.

In the side view in FIG. 1, it can additionally be discerned that the substrate side surfaces 11 are at least partly covered by the thin-film encapsulation 4 formed in a continuous manner without interruption. In particular, the substrate edges 12 adjoined by the organic layer sequence 2 are completely covered by the thin-film encapsulation 4.

In FIG. 1, optionally in addition an anti-scratch protective layer 5 having a layer thickness of between 2 µm and 200 µm is applied to the thin-film encapsulation 4, said anti-scratch protective layer consisting of silicone, for example. In this case, the anti-scratch protective layer covers the sides of the thin-film encapsulation 4 which face away from the organic layer sequence 2 and the substrate 1. The anti-scratch protective layer 5 also covers the substrate side surfaces 11 at least partly and in particular the substrate edges 12 adjoining the organic layer sequence 2.

Furthermore, the anti-scratch protective layer 5 optionally includes scattering particles that at least partly diffusively scatter the radiation emitted by the emitter layer 22. As a result of the diffuse scattering in the anti-scratch protective layer 5, the luminous surface 30 is additionally enlarged in plan view, for which reason the luminous surface in plan view even extends beyond the substrate edges 12. The substrate edges 12 are thus not visible in plan view; the OLED 100 appears marginless.

A section through an OLED 100 embodied in a manner similar to that in FIG. 1 along the line BB' is shown in the embodiment in FIG. 2. In this case, the line BB' runs through the center of the cutout 6 in the OLED 100. As can be discerned in the side view on the right-hand side, the cutout 6 extends through the entire OLED, in particular through the substrate 1, the entire organic layer sequence 2, the electrodes 23, 24 and also through the thin-film encapsulation 4 and the anti-scratch protective layer 5. In the region of the cutout 6, the substrate 1 likewise has substrate side surfaces 11 and substrate edges 12. Here, too, the organic layer sequence 2 and also the electrodes 23, 24 are led as far as the substrate edge 12 and adjoin the substrate edge 12 in a plan view of the luminous surface 30. In plan view the luminous surface 30 thus extends at least as far as the substrate edges 12 of the cutout 6. That has the consequence that the luminous surface 30 in the region of the cutout 6 is not delimited by margins that appear dark from the substrate 1.

It can additionally be discerned in FIG. 2 that the thin-film encapsulation 4 and also the anti-scratch protective layer 5 cover the side surfaces, in particular the substrate side surfaces 11, including in the region of the cutout 6. In the present case, the substrate side surfaces 11 are completely covered by the thin-film encapsulation 4 and the anti-scratch protective layer 5. Moreover, it is evident in FIG. 2 that the anti-scratch protective layer 5 is also applied on an underside of the substrate 1 facing away from the organic layer sequence 2. In the side view, in this case the anti-scratch protective layer 5 completely encloses the organic layer sequence 2 and the substrate 1.

The embodiment in FIG. 3 shows the OLED 100 once again in plan view on the left-hand side and in a sectional illustration with a section along the line CC' on the right-hand side. In this case, the line CC' runs through a contact region 210 of the OLED 100. It can be discerned in the side view in FIG. 3 that the organic layer sequence 2 is recessed by for example at least 1 mm relative to a substrate side surface 11 in the contact region 210, that is to say does not adjoin the substrate edge 12 in the contact region 210. In the contact region 210, the bottom electrode 24 is led laterally beyond the organic layer sequence 2 and can be electrically contacted there. In the contact region 210, the bottom electrode 24 is partly free of the thin-film encapsulation 4 and respectively the anti-scratch protective layer 5. Alternatively, however, it would also be possible for the contact areas to be arranged on a side of the OLED 100 facing away from the luminous surface 30.

Figure 4:
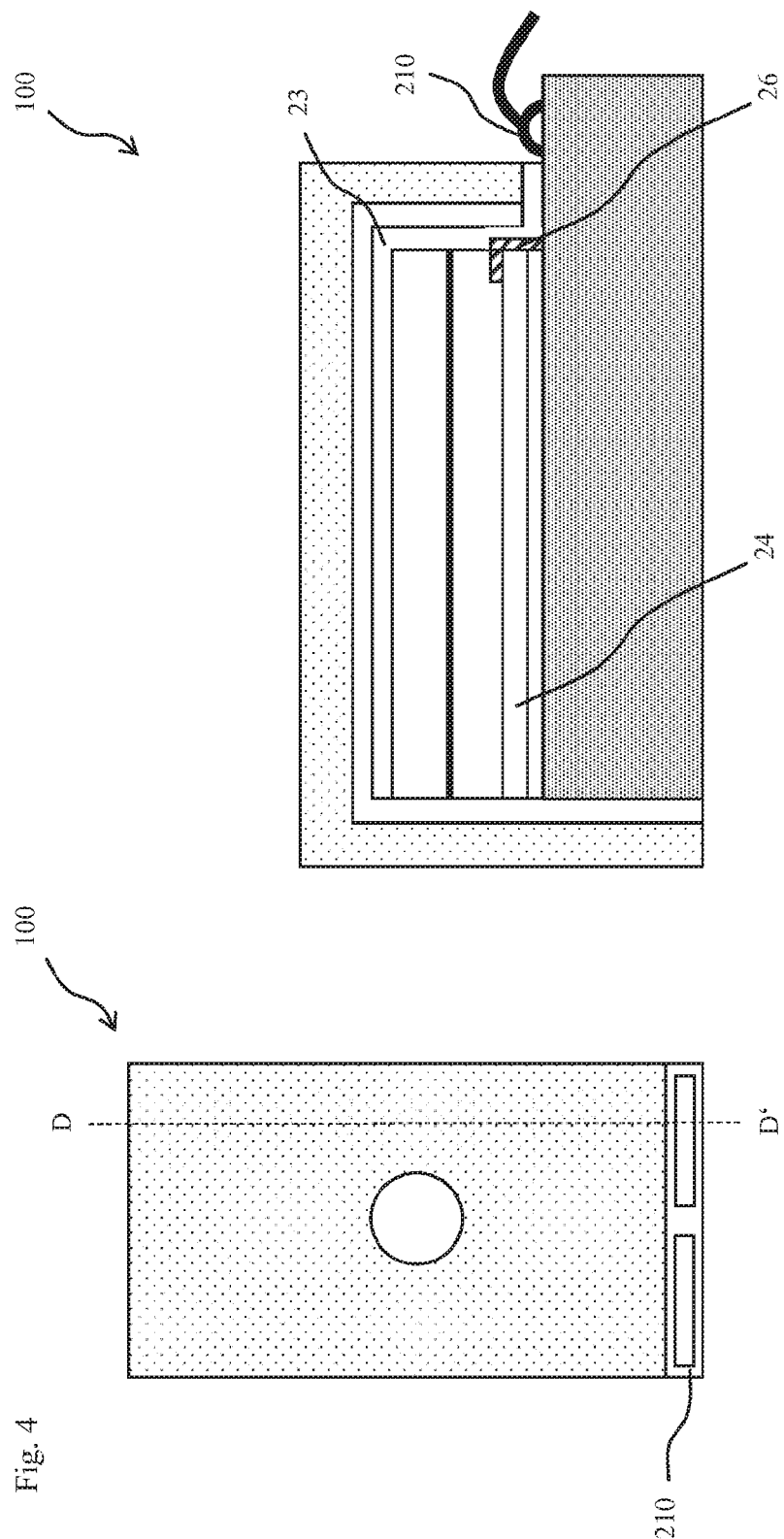

The embodiment in FIG. 4 shows an illustration similar to that in FIG. 3, although here a sectional illustration along the line DD' is shown, which runs through a second contact region 210 of the OLED 100. In the region of said second contact region 210, the OLED 100 is also recessed relative to a substrate side surface 11. At a side surface of the organic layer sequence 2, the top electrode 23 is led down and laterally right into the contact region 210. An electrical insulation layer 26 applied to the bottom electrode 24 prevents a short circuit between the top electrode 23 and the bottom electrode 24. In the contact region 210, which is once again at least partly free of the anti-scratch protective layer 5 and respectively the thin-film encapsulation 4, the top electrode 23 is electrically contacted.

Instead of by means of the insulation layer 26, an electrical insulation between bottom electrode 24 and top electrode 23 can also be achieved by means of the organic layer sequence 2 being drawn laterally over the bottom electrode 24 and covering for example a corresponding side surface of the bottom electrode 24. The organic layer sequence 2 then brings about the insulation between bottom electrode 24 and top electrode 23.

FIG. 5 shows two different embodiments of an OLED 100 in a plan view of the luminous surface 30. In the left-hand illustration, plated-through holes 211 that bring about an electrical contacting between the metallic substrate 1 and the top electrode 23 are situated at corner regions of the OLED 100.

In the right-hand illustration in FIG. 5, instead of the plated-through holes 211, optional contact areas 212 are shown, via which in particular the bottom electrode 24 can be contacted via additional electrical terminals. In the region of the contact areas 212, the luminous surface 30 of the OLED 100 does not extend as far as the margin of the OLED 100.

Figure 6:
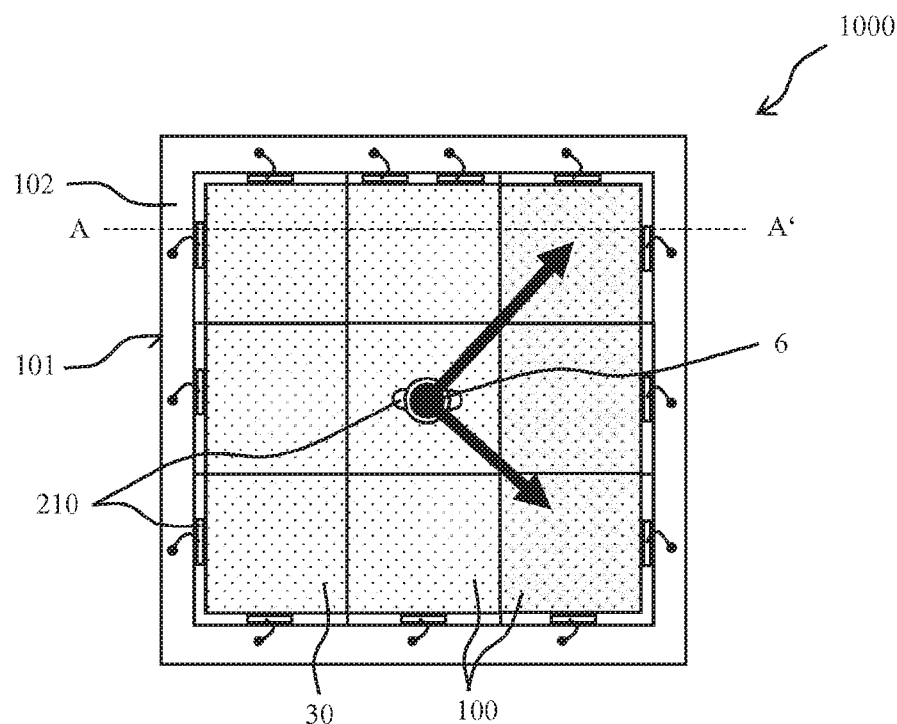
FIGS. 6 and 7 show one embodiment of a light module described here in plan view and in side view.

The embodiment in FIG. 6 shows an organic light module 1000 described here, in plan view. In this case, the organic light module 1000 includes a plurality of rectangular, at least partly structurally identical light-emitting diodes 100 in which the luminous surface 30, as described in association with the previous embodiments, extends to the substrate edges at least in the region of two sides and covers the substrate edges 12 during operation. That is to say that the light-emitting diodes 100 in FIG. 6 appear marginless at least at two sides in the present case. In the example in FIG. 6, the OLEDs 100 are placed against one another such that substrate edges 12 adjoining organic layer sequences 2 bear against one another. As a result, during the operation of the OLEDs 100 a large luminous surface 30 that appears continuous and uninterrupted forms from the individual luminous surfaces 30 of the individual OLEDs 100. For an average observer at a customary distance, trenches between the individual OLEDs 100 are not visible in this case.

Furthermore, FIG. 6 shows that the plurality of OLEDs 100 are applied on a main side 102 of a common carrier 101. The carrier 101 is a printed circuit board, for example, via which the individual OLEDs 100 can be electrically contacted.

In a central region of the organic light module 1000, one of the OLEDs 100 has a cutout 6. In the region of the cutout 6, too, the luminous surface 30 extends as far as the substrate edge 12. Pointers are fitted through the cutout 6, which pointers can be operated for example via a clockwork mechanism on that side of the OLED 100 which faces away from the luminous surface 30. The organic light module 1000 in FIG. 6 thus forms in particular a clock having a background illuminated by OLEDs 100.

Figure 7:
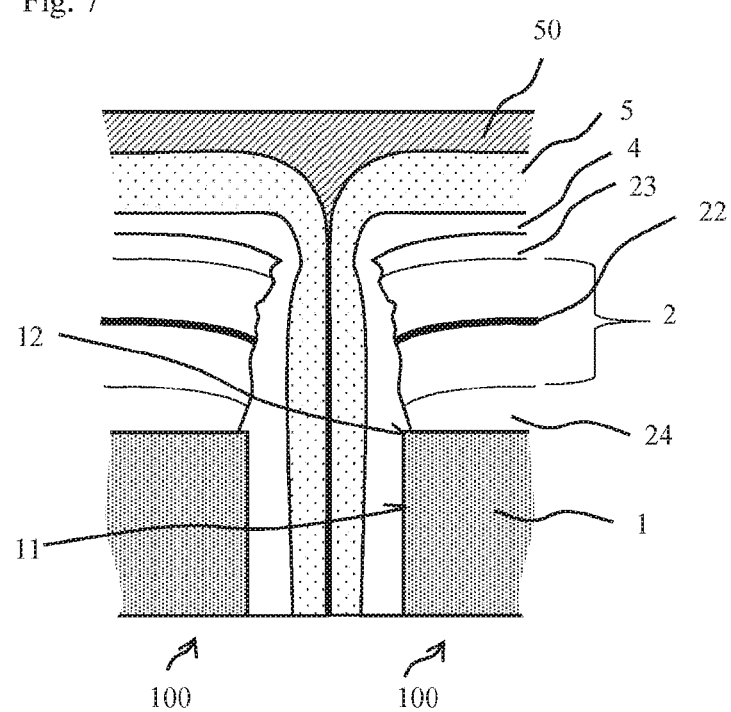

FIG. 7 shows a section through the organic light module 1000 from FIG. 6 along the line AA'. In addition, a region in which the two OLEDs 100 are placed against one another is shown in a detail illustration in FIG. 7. In this case, the substrates 1 or substrate edges 12 situated opposite one another are spaced apart from one another by the layers of the thin-film encapsulation 4 and of the anti-scratch protective layer 5. In particular, the distance between the two substrate edges 12 is for example at most 400 µm. The organic layer sequences 2 and also the bottom electrodes 24 and the top electrodes 23 are arranged in each case on the substrates 1.

It is evident in the zoomed view in FIG. 7 that neither the organic layer sequence 2 nor the electrodes 23, 24 are led exactly as far as the substrate edge 12 of the substrate 1. Rather, the organic layer sequence 2 and the electrodes 23, 24 are laterally spaced apart from the substrate edge 12. In this case, the distance is in the region of, for example, at most 100 µm. For an observer, in a plan view of the luminous surface 30, the organic layer sequence 2 or the luminous surface 30 appears to be led as far as the substrate edge 12.

Furthermore, FIG. 7 shows that a scattering layer 50 is applied to a side of the OLEDs 100 which faces away from the substrates 1, said scattering layer covering in particular the region between the two OLEDs 100. In this case, the scattering layer 50 is formed in a continuous manner without interruption. In particular, the scattering layer 50 may include for example scattering particles such as aluminum oxide particles. As a result of the scattering effect of the scattering layer 50 in the region between the two OLEDs 100, in a plan view of the organic light module 1000, a last remnant of a trench that appears dark between the OLEDs 100 can be masked out for an observer. The common luminous surface 30 of the combined OLEDs 100 can then also appear continuous and without interruption even upon closer examination.

A method step for producing an OLED 100 described above is shown in the embodiment in FIG. 8A. In this case, it can be discerned in the plan view in the left-hand illustration that a plurality of substrates 1 are provided on an auxiliary carrier 8. Two of the substrates 1 have an additional cutout 6, which extend completely through the substrates 1. The right-hand illustration in FIG. 8A shows a cross-sectional view along the line AA'. Both the substrate side surfaces 11 and the substrate edges 12 are discernible here.

The embodiment in FIG. 8B shows a subsequent step in which, at least in partial regions, a mask 7 is applied to the auxiliary carrier 8 or the substrates 1. In this case, the mask 7 bears at least partly against outer side surfaces 11 of the substrates 1 and laterally delimits the top sides 10 there. Furthermore, the mask 7 also covers regions of the top sides 10 of the substrates 1.

The embodiment in FIG. 8C shows a method step in which an organic layer sequence 2 is applied to the top sides 10 of the substrates 1 or to the auxiliary carrier 8. In this case, the organic layer sequence 2 is applied by means of vapor deposition, for example. FIG. 8C does not show steps in which a bottom electrode 23 is applied by vapor deposition before the application of the organic layer sequence 2 and a top electrode 24 is applied by vapor deposition after the application of the organic layer sequence 2.

In the example in FIG. 8C, the organic layer sequences 2 are applied here in such a way that the layer sequence 2 is also applied beyond steps between substrates 1 and auxiliary carriers 8, wherein the organic layer sequence 2 is interrupted in the region of substrate edges 12 serving as tear-off edges. Thus, the organic layer sequence 2 does not run in an uninterrupted fashion in the region of the steps. Rather, regions of the organic layer sequence 2 that are applied on the auxiliary carrier 8 and regions of the organic layer sequence 2 that are applied on the top side 10 are separated from one another and spaced apart from one another by a non-continuous offset.

What is achieved by applying the organic layer sequence 2 beyond the tear-off edges of the substrates 1 is that the organic layer sequence 2 is led as far as the substrate edges 12 of the substrates 1.

In the embodiment in FIG. 8D, the mask 7 is removed. Those regions of the substrates 1 that were previously covered by the mask 7 are free of the organic layer sequence 2. Contact regions 210 for electrically contacting the organic layer sequence 2 or the OLEDs 100 can then be formed in these regions.

FIG. 8E shows a method step in which an encapsulation 4, 5 for example in the form of a thin-film encapsulation 4 and/or an anti-scratch protective layer 5 is additionally applied to the substrates 1 over the whole area. In this case, the encapsulation 4 at least partly covers both the organic layer sequence 2 and the substrate side surfaces 11 of the substrates 1. The parts of the organic layer sequence 2 that are situated on the auxiliary carrier 8 are also at least partly covered by the encapsulation 4, 5.

In the subsequent method step in FIG. 8F, the auxiliary carrier 8 is then detached from the substrates 1. During detachment, both the residues of the organic layer sequence 2 that are situated on the auxiliary carrier 8 and parts of the encapsulation 4, 5 are concomitantly detached. In this case, however, the encapsulation 4, 5 is not attacked in the region of the substrate edges 12 of the substrates 1, such that there the encapsulation 4, 5 still covers the substrate side surfaces 11 and also the organic layer sequence 2. The OLEDs 100 are singulated by the detachment of the auxiliary carrier 2.

In the present embodiments in FIGS. 8A to 8F, the organic layer sequence 2 and the electrodes 23, 24 are applied for example by means of directional physical vaporization or sputtering methods from laterally limited sources. In these so-called line-of-sight methods, the top side 10 brings about a shading of the substrate side surfaces 11. The substrate side surfaces 11 are shaded from the vaporization source in particular by the substrate edges 12, and are therefore not coated by the organic layer sequence 2 and the electrodes 23, 24 during vaporization. By contrast, the thin-film encapsulation 4 is applied for example by means of atomic layer deposition, ALD for short, or chemical vapor deposition, CVD for short. In these methods, the coating takes place from a homogeneous vapor phase, for which reason there are no or fewer shading effects and the substrate side surfaces 11 are also coated conformally. The anti-scratch protective layer 5 is applied beyond the substrate edge 12 advantageously from a solution. A sufficiently viscous anti-scratch protective layer solution is able to reshape the substrate edge 12 and also to cover the substrate side surfaces 11.

Figure 9A:
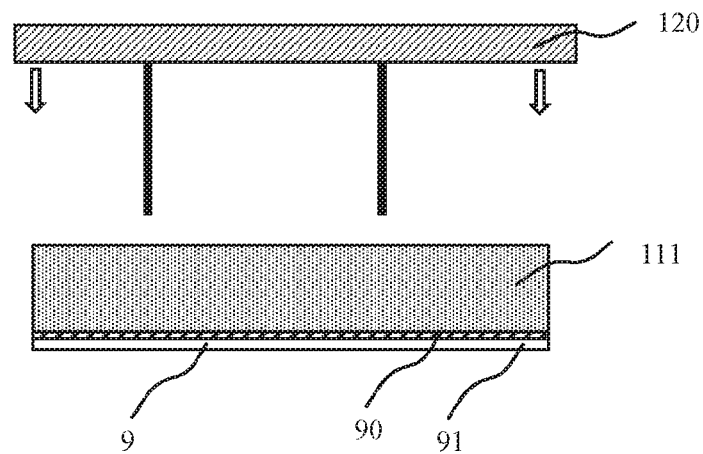

FIG. 9A shows one embodiment of a method step for producing a substrate 1 in side view. In this case, firstly a substrate blank 111 is provided, which is arranged on an adhesive film 9. In this case, the adhesive film 9 is of at least two-layered construction, and includes an adhesive layer 90 and also a connection layer 91. The connection layer 91 and the substrate blank 111 are mechanically connected to one another via the adhesive layer 90.

In addition, FIG. 9A shows the process of providing a stamping tool 120, which is arranged on a side of the substrate blank 111 that faces away from the adhesive film 9.

Figure 9B:
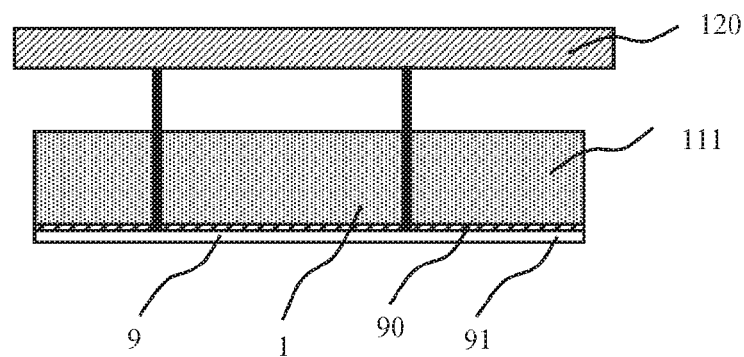

In FIG. 9B, the substrate blank 111 and also the adhesive layer 90 are stamped with the aid of the stamping tool 120, but the connection layer 91 remains intact in the process. By means of the stamping tool 120, a region is cut out from the substrate blank 111, which region later forms the substrate 1.

Figure 9C:
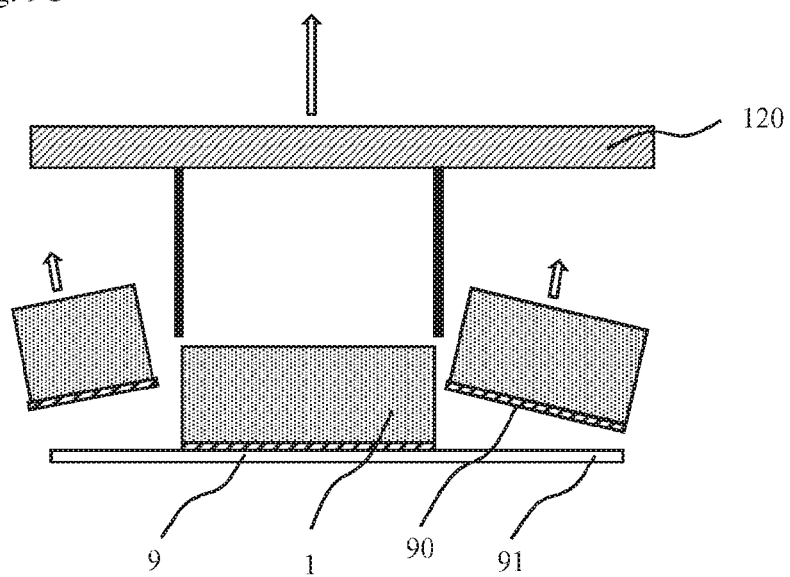

After the withdrawal of the stamping tool 120 in FIG. 9C, the residues of the substrate blank 111 that do not belong to the substrate 1, including the adhesive layer 90 adhering to the residues, can then be detached from the connection layer 91. Therefore, only the substrate 1 connected via the adhesive layer 90 is left on the connection layer 91. The substrate 1 can subsequently be applied on the auxiliary carrier 8 for example after the detachment of the connection film 91.

As an alternative to the method for producing the substrate 1 with the aid of a stamping tool 120 as illustrated in FIGS. 9A to 9C, it is also possible to use a mechanical cutting method or a laser cutting method for cutting out the substrate 1.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An organic light-emitting diode comprising
a substrate having a top side and one or a plurality of substrate side surfaces running transversely with respect to the top side, wherein the top side and the substrate side surfaces are connected to one another in each case via a substrate edge, and
an organic layer sequence applied to the top side and having an emitter layer, which generates electromagnetic radiation during intended operation of the light-emitting diode, wherein the radiation is coupled out from the organic light-emitting diode via a luminous surface, wherein
in a plan view of the luminous surface the organic layer sequence adjoins at least a partial region of at least one substrate edge, wherein in the partial region the luminous surface extends at least as far as the corresponding substrate edge,
an encapsulation formed in an uninterrupted and continuous fashion is applied to the organic layer sequence,
the encapsulation, at least in the region of the substrate edge adjoining the organic layer sequence, is led right onto the associated substrate side surface, at least partly covers the latter and is in direct contact with the substrate side surface.

2. The organic light-emitting diode as claimed in claim 1, wherein in the region of the mutually adjoining substrate edge and organic layer sequence the lateral distance between substrate edge and organic layer sequence is at most 200 μm.

3. The organic light-emitting diode as claimed in claim 1, wherein in a plan view of the luminous surface the organic layer sequence adjoins the substrate edge along the entire lateral extent of the corresponding substrate edge, such that during operation the luminous surface extends at least as far as the substrate edge along the entire substrate edge.

4. The organic light-emitting diode as claimed in claim 1, wherein the organic layer sequence is completely surrounded by the encapsulation on all surfaces not covered by the substrate.

5. The organic light-emitting diode as claimed in claim 1, wherein
the encapsulation comprises a thin-film encapsulation,
the thin-film encapsulation is in direct contact with the substrate side surface.

6. The organic light-emitting diode as claimed in claim 5, wherein
the encapsulation comprises an anti-scratch protective layer,
the thin-film encapsulation has a thickness of between 1 nm and 5 μm and comprises one or more of the following materials: aluminum oxide, zinc oxide, zirconium oxide, titanium oxide, hafnium oxide, lanthanum oxide, tantalum oxide, silicon nitride, silicon oxide, silicon oxynitride, indium tin oxide, indium zinc oxide, aluminum-doped zinc oxide, the thin-film encapsulation is in direct contact with the organic layer sequence, the anti-scratch protective layer is applied on those sides of the thin-film encapsulation which face away from the organic layer sequence.

7. The organic light-emitting diode as claimed in claim 6, wherein the anti-scratch protective layer comprises scattering particles that diffusively scatter the radiation emitted by the emitter layer.

8. The organic light-emitting diode as claimed in claim 6, wherein the anti-scratch protective layer forms an uninterrupted and continuous layer that is fitted at least partly on an underside of the substrate, the underside being situated opposite the top side of the substrate, as a result of which the anti-scratch protective layer is prevented from being vertically detached from the light-emitting diode.

9. The organic light-emitting diode as claimed in claim 1, wherein in a plan view of the luminous surface the organic layer sequence adjoins a plurality of substrate edges in each case along the entire lateral extent of the respective substrate edges, such that the luminous surface extends at least as far as the corresponding substrate edges along a plurality of substrate edges.

10. The organic light-emitting diode as claimed in claim 1, wherein the organic layer sequence adjoins a substrate edge that belongs to a marginal surface that laterally delimits the substrate.

11. The organic light-emitting diode as claimed in claim 1, wherein
the organic light-emitting diode comprises at least one cutout,
the cutout extends completely through the organic layer sequence and the substrate in a direction transversely with respect to the top side of the substrate and is laterally completely surrounded by the organic layer sequence and the substrate,
the organic layer sequence adjoins a substrate edge that laterally delimits the cutout in a plan view of the luminous surface.

12. An organic light module comprising:
a plurality of organic light-emitting diodes comprising
a substrate having a top side and one or a plurality of substrate side surfaces running transversely with respect to the top side, wherein the top side and the substrate side surfaces are connected to one another in each case via a substrate edge, and
an organic layer sequence applied to the top side and having an emitter layer, which generates electromagnetic radiation during intended operation of the light-emitting diode, wherein the radiation is coupled out from the organic light-emitting diode via a luminous surface,
wherein in a plan view of the luminous surface the organic layer sequence adjoins at least a partial region of at least one substrate edge, wherein in the partial region the luminous surface extends at least as far as the corresponding substrate edge, an encapsulation formed in an uninterrupted and continuous fashion is applied to the organic layer sequence, the encapsulation, at least in the region of the substrate edge adjoining the organic layer sequence, is led right onto the associated substrate side surface, at least partly covers the latter and is in direct contact with the substrate side surface, wherein
at least two organic light-emitting diodes are combined such that the substrate edges adjoining the organic layer sequences bear against one another and, as a result, a common luminous surface that appears continuous and free of interruption is formed during the operation of both light-emitting diodes.

13. The organic light module as claimed in claim claim 12, wherein
a continuous scattering layer formed in an uninterrupted fashion is applied to the plurality of the light-emitting diodes and runs parallel to the top sides of the organic light-emitting diodes,
the light modules are covered by the scattering layer at least in the region of the substrate edges placed against one another.

14. A method for producing an organic light-emitting diode comprising the following steps:
A) providing a substrate having a top side and one or a plurality of substrate side surfaces running transversely with respect to the top side, wherein the top side and the substrate side surfaces are connected to one another in each case via a substrate edge;
B) applying an organic layer sequence to the top side of the substrate, such that in a plan view of the top side the organic layer sequence adjoins at least one substrate edge at least in a partial region, wherein the organic layer sequence comprises at least one emitter layer that emits electromagnetic radiation during intended operation of the light-emitting diode;
C) applying an encapsulation formed in an uninterrupted and continuous fashion to the organic layer sequence, wherein the encapsulation, at least in the region of the substrate edge adjoining the organic layer sequence, is led onto the associated substrate side surface, such that the latter is at least partly covered by the encapsulation, wherein
in step A) the substrate is provided on an auxiliary carrier, wherein the top side of the substrate lies on an elevated plane relative to the auxiliary carrier and a step is formed between the top side and the auxiliary carrier, wherein a substrate edge belonging to the step forms a tear-off edge,
in step B) the organic layer sequence is applied laterally beyond the tear-off edge in places, such that both the top side and the auxiliary carrier are at least partly covered by the organic layer sequence, wherein during application the step has the effect that the organic layer sequence is interrupted along the tear-off edge and, as a result, the parts of the organic layer sequence which are applied on the auxiliary carrier are not joined with the parts of the organic layer sequence which are situated on the top side of the substrate,
in a step D), the auxiliary carrier is detached, wherein the parts of the organic layer sequence which are situated on the auxiliary carrier, together with the auxiliary carrier, are removed from the substrate.

15. The method as claimed in claim 14, wherein
in step B), a mask is used for applying the organic layer sequence,
in step C), a thin-film encapsulation is applied to exposed outer surfaces of the organic layer sequence and/or of the substrate, and afterward an anti-scratch protective layer is applied at least to those sides of the thin-film encapsulation which face away from the organic layer sequence.

16. The method as claimed in claim 14,
wherein before step A)
   firstly a substrate blank is applied on the auxiliary carrier,
   afterward the substrate blank is cut to size to form the substrate by means of a stamping method, a mechanical cutting method or a laser cutting method,
   afterward the remnants of the substrate blank that do not belong to the substrate are detached from the auxiliary carrier.

17. The method as claimed in claim 14,
wherein before step A)
   firstly a substrate blank is applied to an intermediate film,
   afterward the substrate is stamped from the substrate blank by means of a stamping method, a mechanical cutting method or a laser cutting method,
   afterward the remnants of the substrate blank that do not belong to the substrate are detached from the intermediate film,
   afterward the substrate is applied to an auxiliary carrier.

* * * * *

UNITED STATES PATENT AND TRADEMARK OFFICE
CERTIFICATE OF CORRECTION

PATENT NO. : 10,249,847 B2
APPLICATION NO. : 15/527336
DATED : April 2, 2019
INVENTOR(S) : Erwin Lang et al.

Page 1 of 1

It is certified that error appears in the above-identified patent and that said Letters Patent is hereby corrected as shown below:

In the Claims

Column 18, Line 9, Claim 13; please change "The organic light module as claimed in claim claim 12, wherein" to --The organic light module as claimed in claim 12, wherein--

Signed and Sealed this
Eighteenth Day of June, 2019

Andrei Iancu
*Director of the United States Patent and Trademark Office*